United States Patent
Ingwersen

(10) Patent No.: US 9,275,777 B2
(45) Date of Patent: Mar. 1, 2016

(54) METHOD FOR PROCESSING AN EMBEDDED METAL FILM

(75) Inventor: Jan Ingwersen, Berlin (DE)

(73) Assignee: Berliner Glas KGaA Herbert Kubatz GmbH & Co., Berlin (DE)

(*) Notice: Subject to any disclaimer, the term of this patent is extended or adjusted under 35 U.S.C. 154(b) by 1021 days.

(21) Appl. No.: 13/422,471

(22) Filed: Mar. 16, 2012

(65) Prior Publication Data

US 2012/0236458 A1  Sep. 20, 2012

(30) Foreign Application Priority Data

Mar. 16, 2011 (DE) .......................... 10 2011 014 162

(51) Int. Cl.
| H05K 3/02 | (2006.01) |
| H05K 3/10 | (2006.01) |
| H01C 3/12 | (2006.01) |
| H01C 17/065 | (2006.01) |
| H01C 17/26 | (2006.01) |

(52) U.S. Cl.
CPC ............ H01C 3/12 (2013.01); H01C 17/06533 (2013.01); H01C 17/265 (2013.01); *Y10T 428/23* (2015.01)

(58) Field of Classification Search
CPC .. H01C 3/12; H01C 17/265; H01C 17/06533; Y10T 428/23
USPC .................... 29/830, 846, 847, 852; 174/254; 219/121.69, 121.85; 250/370.09; 283/94, 107
See application file for complete search history.

(56) References Cited

U.S. PATENT DOCUMENTS

| 4,217,570 A | 8/1980 | Holmes |
| 4,924,064 A * | 5/1990 | Stormbom et al. ...... 219/121.69 |
| 6,082,778 A * | 7/2000 | Solmsdorf .................... 283/107 |
| 6,204,506 B1 * | 3/2001 | Akahori et al. .......... 250/370.09 |
| 2002/0023901 A1 | 2/2002 | Smart |
| 2007/0085337 A1 | 4/2007 | Endres et al. |

FOREIGN PATENT DOCUMENTS

| DE | 10356146 A1 | 6/2005 |
| EP | 2317546 A1 | 5/2011 |
| JP | 2-276205 A | 11/1990 |

OTHER PUBLICATIONS

English-language abstract of JP 02276205 (1990).

\* cited by examiner

*Primary Examiner* — Donghai D Nguyen
(74) *Attorney, Agent, or Firm* — Caesar Rivise, PC

(57) ABSTRACT

A method for processing a metal film (1) embedded in a carrier (2) includes the step of heating the metal film (1) in such a way that the metal film (1) is transformed in a subregion into at least one insulator section (3). The metal film (1) is preferably locally heated by laser radiation (4). Also described is a component (10, 11, 12, 13) which is produced by the method and includes an electrostatic clamp, a drive mechanism which is adapted for moving a workpiece under the action of electrical fields, a resistor element or a display device, for example.

6 Claims, 2 Drawing Sheets

METHOD FOR PROCESSING AN EMBEDDED METAL FILM

BACKGROUND OF THE INVENTION

The invention relates to a method for processing a metal film which is embedded in a carrier, in particular a method for processing a component having a sandwich structure into which a metal film is embedded, such as, for example, a method for processing a component assembled by anodic bonding and having a metallic bonding electrode film. Furthermore, the invention relates to a component (assembly part) with a carrier and a metal film embedded in the carrier, in particular a component produced by the mentioned method. Applications of the invention are in the production of tools for holding or moving workpieces under the action of electrical fields or of resistive heating elements or in the marking of or pattern generation on glass components.

It is generally known that thin metal films (functional metal films) formed on the surface of electrically insulating substrates, such as, for example, formed on glass substrates, can perform numerous different functions. Thin metal films form, for example, transparent electrodes for the generation of electrical fields within the environment of the substrate, resistor elements for an electric resistive heating or provide for visually perceptible surface modifications of the substrate. In order to adapt the metal film on the substrate to the respective function, numerous methods for processing the metal film are known, such as, for example, targeted removal of areas of the metal film, in particular by ablation or etching.

Conventional applications of thin metal films generally have the disadvantage that a metal film on a substrate surface can be affected by environmental influences in a detrimental manner. In order to prevent this, a protective cover layer has to be formed on the metal film, which can only be performed after processing the metal film to adapt it to the respective function and represents an additional, possibly undesirable process effort.

An application of thin metal films is employed, for example, in tools for the handling of workpieces under the action of electrical fields, in particular tools for the handling of wafers in the semiconductor industry. A holding element (a so-called electrostatic clamp) for a wafer comprises a component in the shape of a flat plate on which at least two electrodes are disposed. When a high voltage is applied to the electrodes, an electrical field is generated in the environment of the electrostatic clamp, under the action of which a wafer is drawn to the clamp. For the duration of the application of the high voltage, the wafer can be moved with the clamp, for example, in a coating installation between different workstations. In the case of a conventional electrostatic clamp, the electrodes are formed by depositing a metal film on the surface of a carrier, subsequently structuring the metal film and covering the structured metal film with an insulating cover layer. This method is disadvantageous due to its complexity, in particular in the application with carriers consisting of anodically bonded carrier elements made of glass.

US 2007/0085337 A1 describes a multilayer security element comprising multiple plastic layers and a metal layer. Using a laser beam, identifiers are introduced into the metal layer, in the form of visual patterns, letters, numbers and/or images. By the effect of the laser beam, a changed modification of the metal, i.e., another metallic section, is obtained which has a changed reflectivity.

US 2002/0023901 A1 discloses a local laser processing of a metal being embedded in $SiO_2$. Absorption of laser radiation results in a heating of the metal up to an expansion creating disruptions in the surrounding $SiO_2$. The heated metal can evaporate through the disruptions leaving metal-free sections in the $SiO_2$.

The objective of the invention is to provide an improved method for producing a component with a metal film, in particular for processing a metal film, by which the disadvantages of conventional techniques are avoided. By means of the method according to the invention, the targeted adaptation of the metal film to a predetermined function, such as, for example, the setting of a predetermined shape and/or surface area of the metal film, should be facilitated and/or a protection of the metal film from environmental influences should be improved. Furthermore, it is the objective of the invention to provide an improved component with a metal film by which the disadvantages of conventional components carrying a metal film are overcome. The component should be particularly suited for a reliable and reproducible adaptation of the metal film to the respective function and/or should guarantee a reliable protection of the metal film. The invention should in particular provide for new applications of functional metal films.

The mentioned objectives are achieved by a method and a component of the invention.

SUMMARY OF THE INVENTION

According to a first aspect of the invention, a method for processing a metal film embedded in a carrier is provided, wherein the metal film is heated such that the metal film is transformed in a portion (section of the metal film) into at least one insulator section. The inventors have found that metal films which are subjected to an increase in temperature are even in an embedded state in a carrier subjected to a chemical reaction which results in the formation of the insulator section extending over the thickness of the metal film. The heating of the metal film comprises a locally restricted increase in temperature of at least one portion of the embedded metal film such that, according to the invention, the metal film is transformed in the at least one portion into an electric insulator. The material of the insulator section, for example a metal oxide, is advantageously further permanently fixed to the embedding material of the carrier.

Advantageously, a method that can be carried out easily is provided by means of the invention with which the shape and/or size of an electrically conductive metal film inside a carrier is changed to targetedly adapt the metal film to a predetermined function, for example as an electrode or resistor element. Alternatively, the processing of the metal film can be performed with the purpose to form the at least one insulator section in a predetermined shape. The inventors have found that the optical, visually perceptible properties of the at least one insulator section differ from those of the metal film. While a metal film is highly reflective, for example, the at least one insulator section may be absorbent (in particular dark or black), transparent or opaque, for example. This property allows for the generation of a predetermined, visually perceptible pattern, such as, for example, a picture or graphic symbols, in particular writing, by processing the metal film in the carrier. According to another alternative, the at least one insulator section can be formed to electrically insulate a part of the metal film, for example a defective part of an electrode, from the remaining metal film.

According to a second aspect of the invention, a component is provided which comprises a carrier made of a solid material and a metal film embedded in the carrier. The metal film is transformed in a portion into at least one insulator section. The at least one insulator section is embedded in the carrier, arranged adjacent to the metal film and formed by a heat-induced transformation of the metal film.

The implementation of the invention is advantageously not limited to certain materials or dimensions of the metal film. The term "metal film" is used to refer to any film (layer) of an electrically conductive substance consisting of a metal or including a metal. The invention is preferably implemented with a thin film made of metal as in this case, the transformation of the metal film in the insulator section over the entire thickness of the metal film is facilitated. To this end, the metal film preferably has a thickness that is less than 0.5 µm, particularly preferably less than 0.25 µm. To ensure the function of the metal film in the carrier, for example as an electrode or heating resistor, the metal film preferably features a thickness that is at least 100 nm, preferably at least 250 nm. The term "carrier" is used to refer to any solid and high-melting material (melting point above 500° C.) which is insusceptible to the short-term increase in temperature to transform the metal film into the at least one insulator section and is preferably electrically insulating. The carrier can be formed in one piece from a single material or in several pieces, in particular in several layers from carrier elements, all of which consisting of a common material or of different materials. The metal film is embedded in the carrier, i.e. arranged in the carrier in such a way that the metal film is limited on both sides along its planar expansion by the carrier. The depth of the embedding in the carrier, in particular the thickness of the carrier elements, is preferably at least 100 µm and/or preferably not more than 10 mm, in particular not more than 5 mm. Preferably, the carrier has likewise a laminar (planar) expansion, for example in the shape of a flat or curved plate.

According to a preferred embodiment of the invention, the metal film is locally heated using laser radiation to transform the metal film into an insulator at the site of the irradiation with the laser radiation. In order to achieve at least one insulator section with a linear or planar expansion, the irradiation can be repeated along the desired line or area of the at least one insulator section. The heating of the metal film using laser radiation has the following advantages.

Firstly, the increase in temperature can be limited to the metal film. To this end, laser radiation having a wavelength, which is absorbed by the metal film and at which the carrier is transparent is preferably used. The wavelength of the laser radiation is typically chosen from the ultraviolet, visible or infrared spectral region, while the carrier is at least on that side from which the laser radiation is directed onto the metal film for laser radiation of the chosen wavelength transparent. Secondly, the laser radiation makes local heating of the metal film possible. The transformation of the metal film into the insulator section is in each case limited to the irradiation site and is possible without a detrimental damage of the embedding material such that the surrounding materials of the carrier and the adjacent metal film remain virtually unaffected. Undesirable changes of the carrier, such as, for example, thermally induced distortions, can be avoided. Furthermore, the locally acting laser radiation makes processing the metal film with a high spatial resolution possible. This is particularly advantageous for the structuring of electrodes. Thirdly, the laser radiation provides the opportunity to set or change the at least one irradiation site on the metal film in a simple manner. In order to form a linear or planar insulator section, for example, it is provided for moving the optical path of the laser radiation and the carrier with the metal film relative to one another to transform the metal film into the at least one insulator section along a line or area. The optical path of the laser radiation can be moved relative to the carrier using movable deflection optics, or the carrier can be moved relative to the optical path of the laser radiation by a mechanical drive.

The laser radiation can be focused onto the metal film. The focused irradiation can have advantages with regard to the setting of a particularly high transformation temperature and the formation of the insulator section with a high spatial resolution. Alternatively, an unfocused irradiation can be provided. If the intensity of the laser radiation is sufficiently high to achieve the desired transformation temperature, in this case, a larger insulator section can be formed in comparison to the focused irradiation. In order to form a strip-shaped insulator section with a certain strip width, an irradiation field with a diameter equal to the desired irradiation width can be generated by defocusing.

The implementation of the invention is not limited to the processing of a single metal film embedded into the carrier. Rather, the carrier can have a sandwich structure in which the two or more metal films are arranged on top of each other and separated by layer-shaped carrier elements. The metal films can be processed selectively to form complex spatial electrode arrays, for example. The selective processing is possible, for example, by targeted focusing of the laser radiation onto a certain layer depth in the carrier and/or by using metals absorbing in different spectral regions.

Studies carried out by the inventors have shown that the section of the metal film which is transformed by the increase in temperature is electrically insulating. Metal within the metal film is at least partially oxidized by the increase in temperature, in particular under the action of the laser radiation to form the insulator section. The oxygen required for the oxidation can be contained in the metal film. However, the carrier into which the metal film is embedded preferably comprises a material containing oxygen, such as, for example, an inorganic oxide compound. Advantageously, the provision of oxygen for the transformation of the metal film is thus facilitated.

According to another preferred embodiment of the invention, the carrier comprises two electrically insulating carrier elements, the metal film being arranged therebetween. At least one of the carrier elements is preferably transparent such that the laser radiation can be directed through the transparent carrier element onto the metal film. For numerous applications of the invention, for example in an electrostatic clamp, in an electric heater or for the generation of a visually perceptible pattern, at least one of the carrier elements is a carrier element made of glass, for example made of AF glass or BF glass (protected names). The second carrier element can likewise consist of glass or ceramics, for example. Thus, as preferred examples, the carrier elements preferably can be made of glass and/or ceramic, i.e., both carrier elements can be made of glass or ceramic, or one of the carrier elements can be made of glass, while the other can be made of ceramic.

In order to form a mechanically stable carrier and to reliably embed the metal film into the carrier, the carrier elements are preferably connected by bonding (in particular anodic bonding) or by high-temperature adhering (high-temperature bonding, e.g. glass frit). According to preferred variants of the invention, the metal film is formed from chrome (Cr), titanium (Ti) and/or aluminum (Al). The metal film can, for example, comprise a bonding electrode, in particular a bonding electrode made of Cr, between bonded carrier elements forming the carrier. According to the invention, it is thus proposed to use a bonding electrode for the anodic bonding of carrier elements made of glass and/or ceramics in addition to the formation of at least one structured metal film in a component part including the bonded carrier elements.

Advantageously, different variants exist to provide the at least one insulator section in the metal film. For example, the at least one insulator section can divide the metal film into at least two separate metal film sections. This variant of the invention is particularly advantageous for the production of an electrostatic clamp including two planar electrodes which are provided for the application of a high voltage. Furthermore, the at least one insulator section within the carrier can form a predetermined array of electrodes having an arbitrary geometry. An electrode array can comprise, for example, electrode areas and/or electrode strips, in particular straight or curved electrode strips. For example, an electrode array can comprise two electrodes with comb-shaped, intermeshing electrode strips. Such an electrode array can be used in the application of alternating electrical fields as a contactless electric drive (linear drive).

It is not mandatory that the processing of the metal film is performed to adapt its properties as, for example, an electrode. Alternatively, for certain applications of the invention, the provision of the at least one insulator section having a predetermined shape may be of interest. The at least one insulator section forms a dark, partly transparent film, for example. By means of the method according to the invention, a pattern can be inscribed into the carrier to achieve a decorative effect or mark a component, for example.

According to a first preferred application, the component according to the invention comprises a holding element of an electrostatic holding mechanism (electrostatic clamp). The electrostatic clamp preferably comprises two carrier elements made of glass, which form the carrier and between which the metal film is embedded. The metal film is, for example, a bonding electrode film (bonding electrode), which is provided for connecting the glass carrier elements by means of anodic bonding. In order to form the electrostatic clamp, the metal film is divided into at least two planar electrodes which are separated from one another by at least one insulator section produced according to the invention.

According to a second preferred application, the component according to the invention comprises a drive mechanism which is adapted for moving a workpiece under the action of alternating electrical fields (traveling fields, linear drive). With particular preference, the carrier is in this case also formed by two anodically bonded glass carrier elements wherein according to the invention, the metal film intended for bonding is transformed into an electrode array of at least two electrodes with a multiplicity of electrode areas and/or electrode strips.

According to a third application, the component according to the invention preferably comprises at least one electric resistor, in particular at least one electric heating resistor. By means of the method according to the invention, it is possible to set the size of the metal film and thus its electric sheet resistance.

Finally, according to another application of the invention, the component according to the invention comprises a glass component wherein the at least one insulator section produced according to the invention forms a visually perceptible pattern for decorative and/or marking purposes.

BRIEF DESCRIPTION OF THE DRAWINGS

Further advantages and details of the invention are described below with reference to the attached drawings. The figures show as follows.

DETAILED DESCRIPTION OF PREFERRED EMBODIMENTS

Preferred embodiments of the method and the component according to the invention will be described below with exemplary reference to the processing of a metal film, which is a bonding electrode film in a carrier assembled from two carrier elements by anodic bonding. The method for producing the carrier by anodic bonding is not described in detail as it is known per se from the prior art. It is emphasized that the application of the invention is not limited to the processing of a bonding electrode film in a carrier produced by bonding. Rather, the invention can also be applied to the processing of metal films, which are embedded in other carriers consisting of two carrier elements glued to each other, for example. Furthermore, by way of example, reference is made to the transformation of the metal film using laser radiation. Alternatively, locally restricted heating can be provided for, for example by masked thermal radiation.

Figure 1:
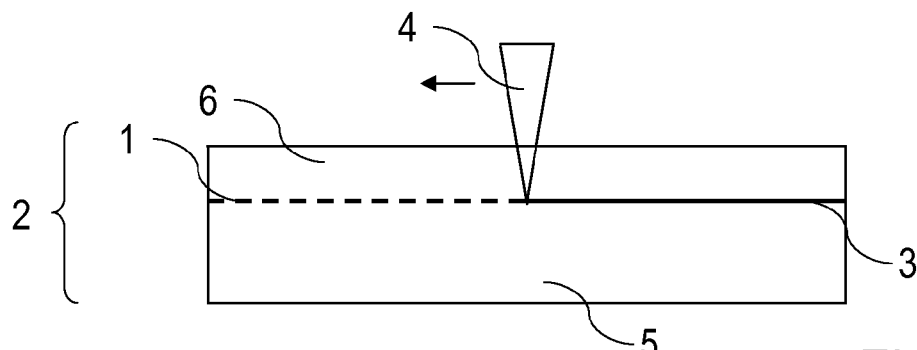
FIG. 1: a schematic illustration of a preferred embodiment of the processing according to the invention of a metal film.

FIG. 1 illustrates, in a schematic sectional view, a carrier 2 with an embedded metal film 1 which is transformed into an insulator section 3 under the action of laser radiation 4. The carrier 2 comprises two carrier elements 5, 6, of which the lower carrier element comprises an insulating ceramic or a glass and has a thickness of 15 mm, for example. The upper carrier element 6 consists e.g. of AF glass (protected name) with a thickness of 0.1 mm. The metal film 1 consists e.g. of Cr with a thickness of 250 nm.

In order to transform the metal film 1 into the insulator section 3, the laser radiation 4 (e.g. $\lambda=355$ nm) is directed onto the metal film 1 in a defocused manner. The defocused laser radiation 4 has a beam diameter on the metal film 1 which depends on the degree of defocusing and is e.g. 0.1 mm in a concrete exemplary embodiment. Alternatively, focused irradiation can be provided for, the radiation field of which, in a concrete exemplary embodiment, has a diameter on the metal film 1 of less than or equal to 40 μm, e.g. 10 μm.

By moving the laser radiation relative to the carrier 2, the metal film 1 is transformed into the insulator section 3 along a predetermined line or strip profile. The movement is carried out with a speed (writing speed) of 7.5 mm/s, for example. The width of the strip is equal to the beam diameter on the metal film 1. In order to form a strip-shaped insulator section 3 having a width of e.g. 140 μm, the focused irradiation is carried out with a beam diameter of 40 μm along ten overlapping, staggered lines, for example.

If the insulator section 3 is to be generated with a predetermined width and the intensity of the laser radiation 4 within the radiation field having a diameter equal to this width would not be sufficient to set a sufficiently high transformation temperature, repeated, in each case offset irradiation with a beam diameter smaller than the strip width can be provided for. In order to generate planar insulator sections, the metal film 1 can correspondingly be irradiated along an irradiation profile in a line-shaped manner until the desired area has been completely transformed into the insulator section. In order to generate an insulator section in the shape of a circular area, an irradiation is, for example, provided for, with which the metal film 1 is transformed into the insulator along concentric circles.

The selection of the laser radiation power and the defocusing on the metal film 1 is chosen in such a way that the desired transformation temperature is achieved in the metal film 1. The transformation temperature depends on the metal in the metal film 1, the thickness of the metal film 1 and the availability of oxygen in the metal film 1 and/or in the surrounding material of the carrier 2 and is e.g. in the range of from 1000° C. to 3000° C. It is not mandatory to know the transformation temperature. Rather, it is sufficient for the implementation of the invention to set the laser radiation 4 (intensity and/or beam diameter on the metal film 1) in such a way that the desired transformation of the metal film 1 takes place. This setting can be realized by a person skilled in the art by means of simple experimentation or with an estimation of the temperature of a metal film absorbing the laser radiation and disposed on a free surface of a carrier. In this connection, the processing power is equal to a vaporization and/or erosion output of the metal in the atmosphere, for example.

Figure 2:
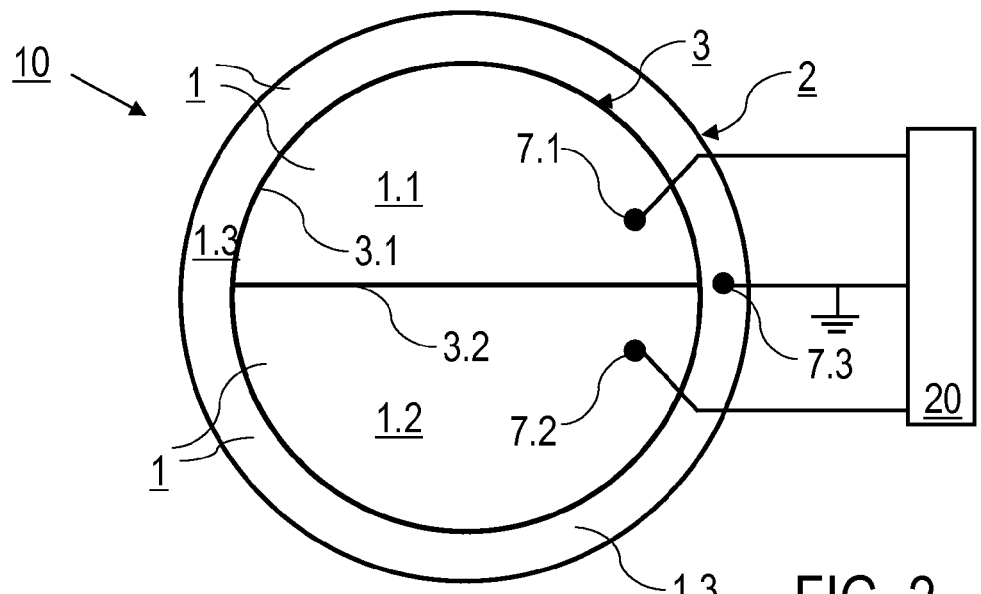
FIG. 2: a schematic plan view of an electrostatic clamp produced by the method according to the invention.

FIG. 2 schematically illustrates a plan view of a first embodiment of a component according to the invention forming an electrostatic clamp 10 (electrostatic holding element 10). The component comprises a carrier 2 which, as shown in FIG. 1, is assembled from two carrier elements by anodic bonding and into which a metal film 1 is embedded. By means of the method according to the invention, an insulator section 3 in the shape of a circular ring 3.1 with a strip 3.2 running transversely within the circular ring 3.1 is formed in the metal film 1. Through this, the metal film 1 is divided into two electrodes 1.1, 1.2, each in the shape of a semicircular area, and a ring electrode 1.3. The diameter of the carrier 2 is e.g. 33 cm. The width of the insulator section 3 along the circular ring 3.1 and along the strip 3.2 is e.g. 140 µm or 250 µm. The width of the ring electrode 1.3 is e.g. 2 cm.

The electrodes 1.1, 1.2 and 1.3 are completely covered by the upper glass carrier element (for example carrier element 6 in FIG. 1) such that they are electrically insulated from the environment. Furthermore, the electrodes 1.1, 1.2 and 1.3 are isolated from each other by the insulator section 3. For contacting the electrodes 1.1, 1.2 and 1.3, contact holes 7.1, 7.2 and 7.3 are formed in the upper glass carrier element through which an electrical connection of the electrodes 1.1, 1.2 and 1.3 with a voltage supply unit 20 is made. The contact holes 7.1, 7.2 and 7.3 having a diameter of mm, for example, are formed by etching the upper glass carrier element with hydrofluoric acid, for example. The etching of the contact holes 7.1, 7.2 and 7.3 is carried out by means of foil masking. The metal film 1 serves as an etch stop in the etching process. As an alternative to the etching, the contact holes 7.1, 7.2 and 7.3 can be generated mechanically in the upper carrier element by drilling or polishing prior to the bonding. The voltage supply unit 20 comprises a high-voltage source which is adapted for applying a positive or negative high voltage, e.g. +/−4 kV, to the electrodes 1.1 and 1.2 and connecting the ring electrode 1.3 with ground potential.

For the application for the transport of workpieces, for example semiconductor wafers, the electrostatic clamp 10 further comprises a holding mechanism and/or a drive mechanism which is formed as such as in conventional electrostatic clamps and is not depicted in FIG. 2.

Differing from FIG. 2, the electrostatic clamp 10 can be equipped with other electrode shapes or with further partial electrodes.

Figure 3:
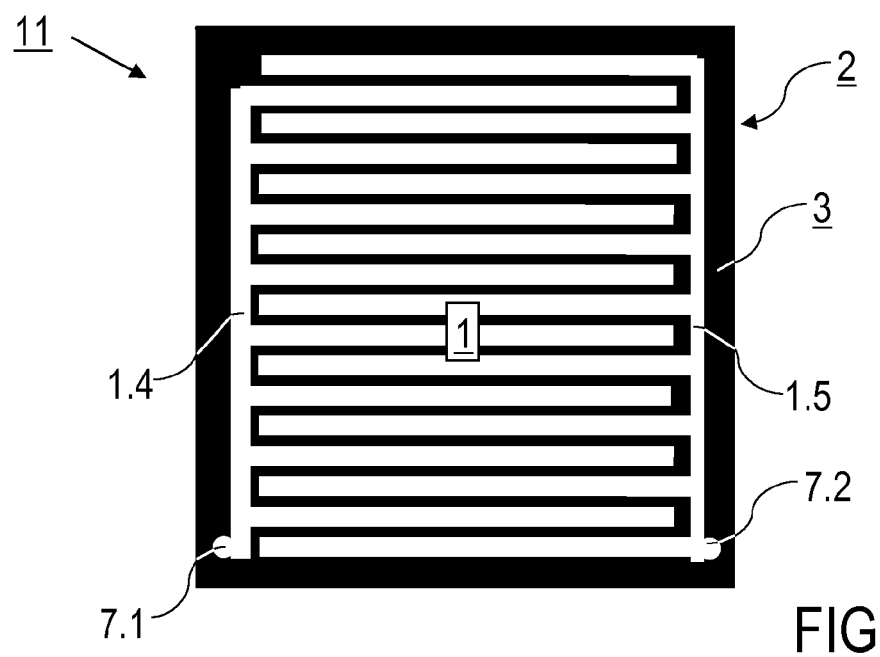
FIG. 3: a schematic plan view of an electrode array for a contactless drive produced by the method according to the invention.

FIG. 3 illustrates, in a schematic plan view, another component forming a drive mechanism 11 for the movement of a workpiece under the action of traveling electrical fields. In this case, the carrier 2 is likewise produced from two carrier elements by anodic bonding above an interposed bonding electrode film, as depicted in FIG. 1. The bonding electrode film forms the metal film 1 which, for the embodiment in accordance with FIG. 3, is structured into an electrode array with two comb-shaped electrodes 1.4, 1.5. By means of the method according to the invention, an insulator section 3 is formed, which is composed of a meander-shaped strip and a rectangular strip frame.

Each of the electrodes 1.4, 1.5 of the electrode array is contacted through a contact hole 7.1, 7.2 in the upper carrier element and is connected with a voltage supply unit (not depicted). The comb-shaped electrodes 1.4, 1.5 are formed with intermeshing strip-shaped electrode fingers and electric alternating voltages, each with opposing polarities, can be applied to these electrodes. As a result, traveling electrical fields can be generated with the electrodes 1.4, 1.5 adjacent to the component part 11, it being possible to move a workpiece, such as, for example, a semiconductor wafer, on a gas bed under the action of these fields.

The implementation of the invention is not limited to the illustrated layout of the electrode array, but can be modified as a function of the concrete application of the invention, e.g. as a function of the desired orientation of the field action.

Figure 4:
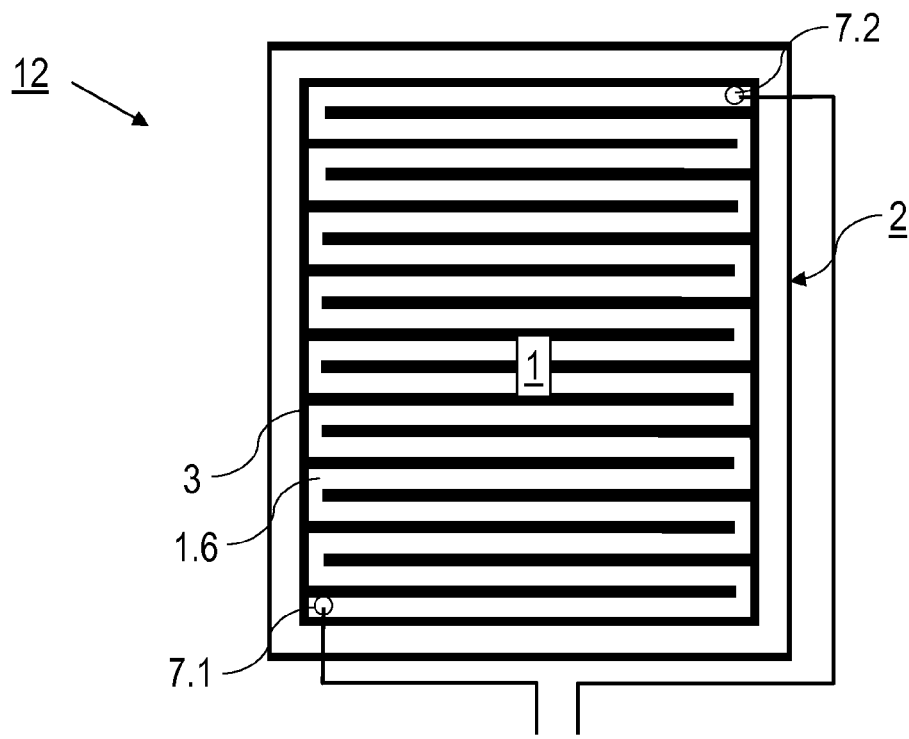
FIG. 4: a schematic plan view of an electric heating resistor produced by the method according to the invention.

FIG. 4 illustrates another component in the shape of a heating resistor 12 wherein a metal film 1 is structured for the formation of a predetermined value of the electric resistance. As depicted in FIG. 1, the carrier 2 of the heating resistor 12 comprises two carrier elements which are connected by anodic bonding, the bonding electrode film providing the metal film 1. By means of the method according to the invention, the insulator section 3 is formed in such a way that a meander-shaped electrode 1.6 is formed. By setting the width of the insulator section 3, the sheet resistance of the electrode 1.6 and thus e.g. a heating output of a heating resistor 12 can be set (trimming of the resistor).

Figure 5:
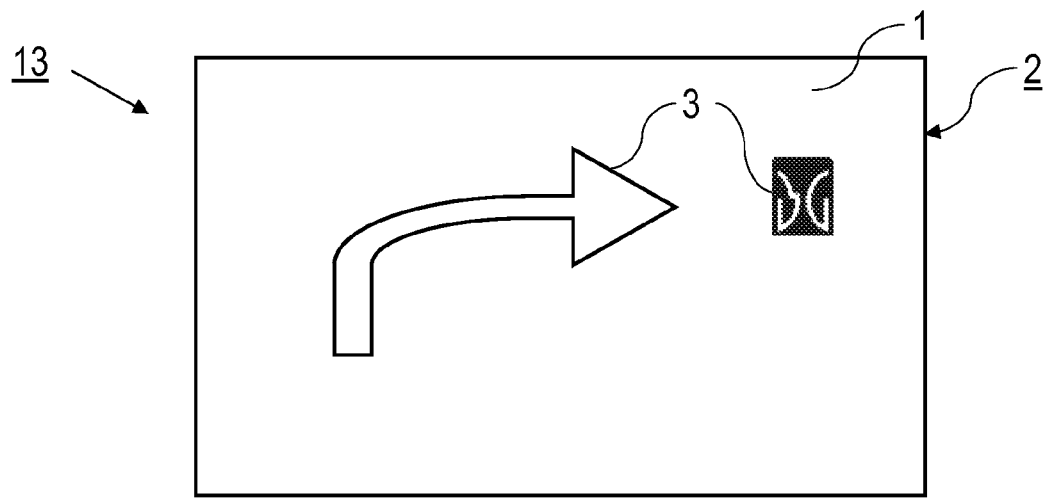
FIG. 5: a schematic plan view of a component part according to the invention wherein the at least one insulator section forms a visually perceptible pattern.

Finally, FIG. 5 illustrates the generation of a visually perceptible pattern in a display device 13 according to another embodiment of the invention. The metal film 1 is embedded in the carrier 2 of the display device 13. The metal film 1 is specular reflective. By means of the locally restricted increase in temperature of the metal film 1, several insulator sections 3 are formed, wherein the metal of the metal film 1 is transformed into a highly absorbing, e.g. black pattern.

The features of the invention disclosed in the description, the drawings and the claims can be significant individually as well as in combination for the realization of the invention in its different embodiments.

What is claimed is:

1. A method for producing a holding carrier of an electrostatic clamp having at least two planar electrodes which are suitable for having an electrostatic clamping voltage applied thereto, said method comprising the steps of:
   providing the holding carrier by anodic bonding of two electrically insulating carrier elements, wherein at least one of the carrier elements is transparent, and a bonding electrode metal film is arranged between the carrier elements such that the bonding electrode metal film is embedded in the holding carrier, and
   locally heating the bonding electrode metal film embedded in the holding carrier by laser radiation in such a way that the bonding electrode metal film is transformed in a portion into at least one insulator section, wherein the at least two planar electrodes of the electrostatic clamp are created by dividing the bonding electrode metal film into at least two portions being separated from one another by the at least one insulator section, and the locally heating step comprises moving the holding carrier and an optical path of the laser radiation relative to one another to transform the bonding electrode metal film into the at least one insulator section along a line or an area.

2. The method according to claim 1, further comprising at least one feature selected from the group consisting of:

the bonding electrode metal film is locally heated by laser radiation having a wavelength at which the carrier is transparent, the bonding electrode film is locally heated by focused or defocused laser radiation, the carrier contains an oxygen-containing material, and metal contained in the bonding electrode metal film is oxidized by the heating.

3. The method according to claim 1, wherein the carrier elements are made of at least one of glass and ceramic.

4. The method according to claim 1, wherein the bonding electrode metal film is formed from at least one of Cr, Ti and Al.

5. The method according to claim 1, wherein the at least one insulator section from the bonding electrode metal film forms at least one electrode in a predetermined shape, and the at least one insulator section in the carrier forms a predetermined pattern.

6. The method according to claim 1, wherein the at least two planar electrodes are suitable for having applied thereto a voltage of ±4 kV.

* * * * *